United States Patent
Park et al.

(10) Patent No.: US 10,497,716 B2
(45) Date of Patent: Dec. 3, 2019

(54) SEMICONDUCTOR MEMORY DEVICE AND MANUFACTURING METHOD THEREOF

(71) Applicant: SK hynix Inc., Gyeonggi-do (KR)

(72) Inventors: In Su Park, Gyeonggi-do (KR); Ki Hong Lee, Gyeonggi-do (KR); Hye Jeong Cheon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/031,588

(22) Filed: Jul. 10, 2018

(65) Prior Publication Data

US 2018/0323211 A1 Nov. 8, 2018

Related U.S. Application Data

(60) Continuation of application No. 15/821,435, filed on Nov. 22, 2017, now Pat. No. 10,050,056, which is a division of application No. 15/279,099, filed on Sep. 28, 2016, now Pat. No. 9,859,299.

(30) Foreign Application Priority Data

May 4, 2016 (KR) .................. 10-2016-0055548

(51) Int. Cl.
*H01L 27/11582* (2017.01)
*H01L 21/28* (2006.01)
*H01L 21/02* (2006.01)

(52) U.S. Cl.
CPC .. *H01L 27/11582* (2013.01); *H01L 21/02359* (2013.01); *H01L 21/28282* (2013.01); *H01L 29/40117* (2019.08); *H01L 21/02164* (2013.01); *H01L 21/02318* (2013.01)

(58) Field of Classification Search
CPC .......... H01L 27/11551–11556; H01L 27/11578–11582
See application file for complete search history.

(56) References Cited

U.S. PATENT DOCUMENTS

| | | | |
|---|---|---|---|
| 2013/0207178 A1* | 8/2013 | Lee | H01L 29/66833 257/324 |
| 2017/0018563 A1* | 1/2017 | Nishida | H01L 27/11582 |

* cited by examiner

*Primary Examiner* — Robert G Bachner
*Assistant Examiner* — Molly K Reida
(74) *Attorney, Agent, or Firm* — IP & T Group LLP

(57) ABSTRACT

Provided herein is a semiconductor device including: a channel layer; a data storage layer surrounding the channel layer and extending along the channel layer; interlayer insulating layers surrounding the data storage layer and stacked along the channel layer, wherein the interlayer insulating layers are spaced apart from each other, wherein a conductive area is disposed between the interlayer insulating layers; a conductive pattern disposed in the conductive area and surrounding the data storage layer; buffer patterns disposed between the interlayer insulating layers and the data storage layer and surrounding the data storage layer, wherein each of the buffer patterns includes a densified area, wherein the buffer patterns are separated from each other by the conductive area; and a blocking insulating pattern disposed between the conductive pattern and the data storage layer and surrounding the data storage layer.

18 Claims, 13 Drawing Sheets

SEMICONDUCTOR MEMORY DEVICE AND MANUFACTURING METHOD THEREOF

CROSS-REFERENCE TO RELATED APPLICATION

This application is a continuation of U.S. patent application Ser. No. 15/821,435 filed on Nov. 22, 2017, titled "SEMICONDUCTOR DEVICE AND MANUFACTURING METHOD THEREOF", which is a division of U.S. patent application Ser. No. 15/279,099 filed on Sep. 28, 2016, and now U.S. Pat. No. 9,859,299 issued on Jan. 2, 2018, which claims priority under 35 U.S.C. § 119(a) to Korean patent application number 10-2016-0055548 filed on May 4, 2016. The disclosure of each of the foregoing applications is incorporated herein by reference in its entirety.

BACKGROUND

Field of Invention

Various embodiments of the present disclosure relate to a semiconductor device and a manufacturing method thereof, and more particularly, to a semiconductor device which includes a conductive pattern surrounding a channel layer, and a manufacturing method thereof.

Description of Related Art

A semiconductor device may include a memory device capable of storing data. The memory device may include memory cells. The memory cells may be arranged in three dimensions. To improve operational characteristics of such memory cells, various technical developments are required. In this case, the memory cells may be coupled to conductive patterns that surround a channel layer.

SUMMARY

An embodiment of the present disclosure provides a semiconductor device including: a channel layer; a data storage layer surrounding the channel layer and extending along the channel layer; interlayer insulating layers surrounding the data storage layer and stacked along the channel layer, wherein the interlayer insulating layers are spaced apart from each other, wherein a conductive area is disposed between the interlayer insulating layers; a conductive pattern disposed in the conductive area and surrounding the data storage layer; buffer patterns disposed between the interlayer insulating layers and the data storage layer and surrounding the data storage layer, wherein each of the buffer patterns includes a densified area, wherein the buffer patterns are separated from each other by the conductive area; and a blocking insulating pattern disposed between the conductive pattern and the data storage layer and surrounding the data storage layer.

An embodiment of the present disclosure provides a manufacturing method for a semiconductor device, including: alternately stacking first layers and second layers; forming a hole passing through the first layers and the second layers; forming a buffer layer over a sidewall of the hole; curing dangling bonds in the buffer layer to form a first densified area in the buffer layer; forming a data storage layer over the first densified area; and forming a channel layer over the data storage layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
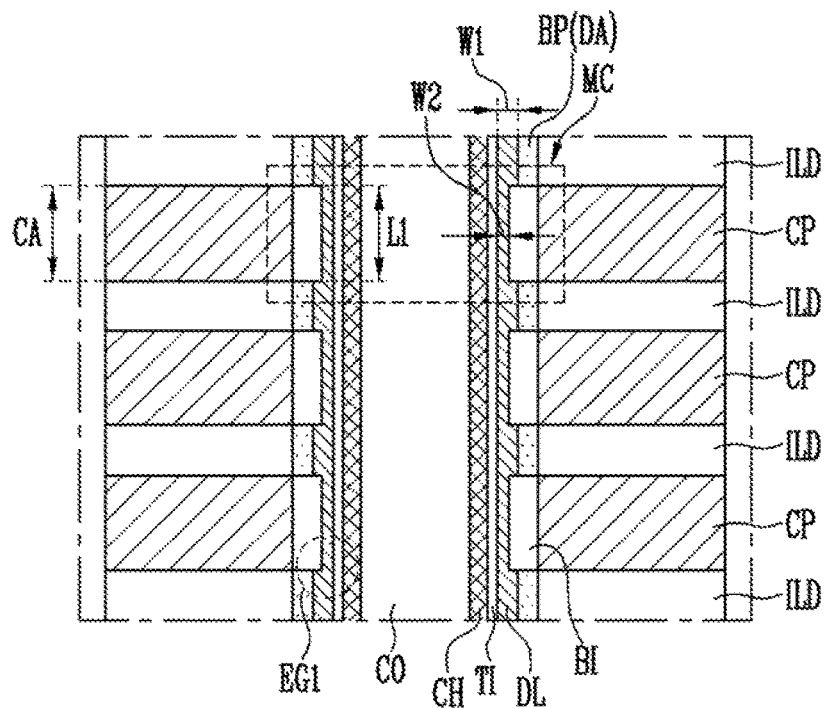
FIGS. 1A to 1D are sectional views illustrating a memory cell of a semiconductor device in accordance with embodiments of the present disclosure.

Hereinafter, embodiments will be described in greater detail with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural form as long as it is not specifically identified as singular in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Embodiments of the present disclosure provide a semiconductor device which has improved operational reliability, and a manufacturing method thereof.

FIGS. 1A to 1D are sectional views illustrating a memory cell of a semiconductor device in accordance with embodiments of the present disclosure.

Referring to FIGS. 1A to 1D, a memory cell MC of a semiconductor device in accordance with an embodiment of the present disclosure may have a Gate All Around (GAA) structure. The GAA structure includes a conductive pattern CP which surrounds a channel layer CH. The memory cell MC may include a data storage layer DL which is disposed between the channel layer CH and the conductive pattern CP, a tunnel insulating layer TI which is disposed between the data storage layer DL and the channel layer CH, and a blocking insulating pattern BI which is disposed between the data storage layer DL and the conductive pattern CP. The data storage layer DL, the tunnel insulating layer TI, and the blocking insulating pattern BI surround the channel layer CH. The data storage layer DL and the tunnel insulating layer TI extend along the channel layer CH.

The conductive pattern CP may be disposed in a conductive area CA. The conductive area CA may be formed between interlayer insulating layers ILD which are stacked along the channel layer CH.

The data storage layer DL and the tunnel insulating layer TI may extend along sidewalls of the interlayer insulating layers ILD. The data storage layer DL may extend on the sidewalls of the interlayer insulating layers ILD. Buffer patterns BP are interposed between the data storage layer DL and the interlayer insulating layers ILD. The buffer patterns BP may be separated from each other by the blocking insulating pattern BI interposed therebetween.

The channel layer CH may have a tube shape and surround a core insulating layer CO. The core insulating layer CO may not be formed. In this case, the channel layer CH may include a central region filled with a semiconductor layer. The cross-section of the channel layer CH may have various shapes, such as a circle, an ellipse, a rectangle, a square, and a polygon.

The data storage layer DI may be divided into first areas defined between the buffer patterns BP and the channel layer CH and a second area defined between the block insulating pattern BI and the channel layer CH. The blocking insulating pattern BI may extend further into the data storage layer DL than the buffer patterns BP. In this case, a thickness W2 of the second area of the data storage layer DL may be less than a thickness W1 of each of the first areas. More particularly, the data storage layer DL may include a first sidewall which faces the channel layer CH and is planar, and a second sidewall which faces the interlayer insulating layers ILD and the conductive pattern CP and has an uneven surface structure. The second sidewall may have a depression into which the blocking insulating pattern BI extends, and protrusions which face the interlayer insulating layers ILD.

Figure 1B:
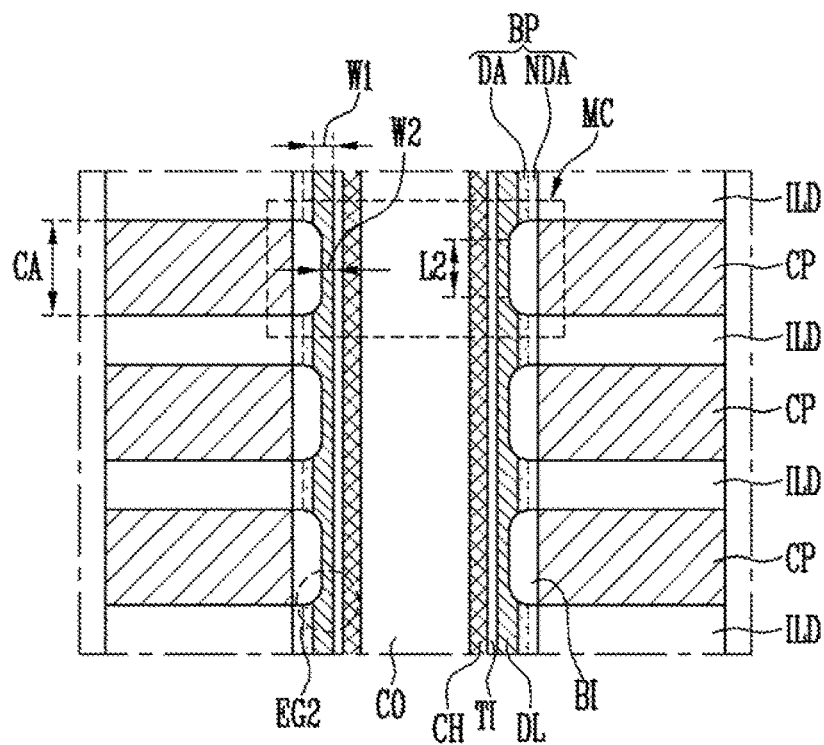
Figure 1C:
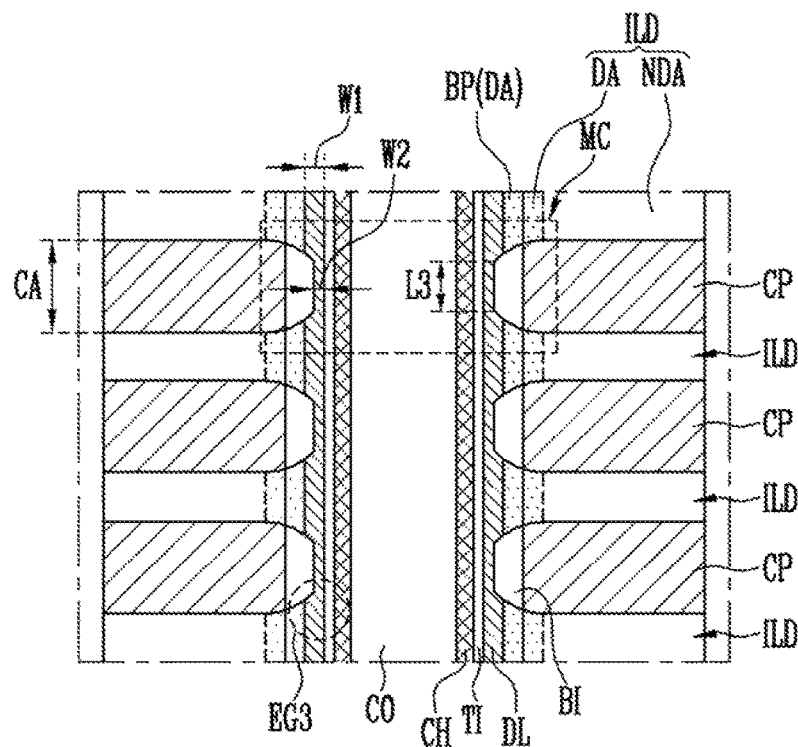
Figure 1D:
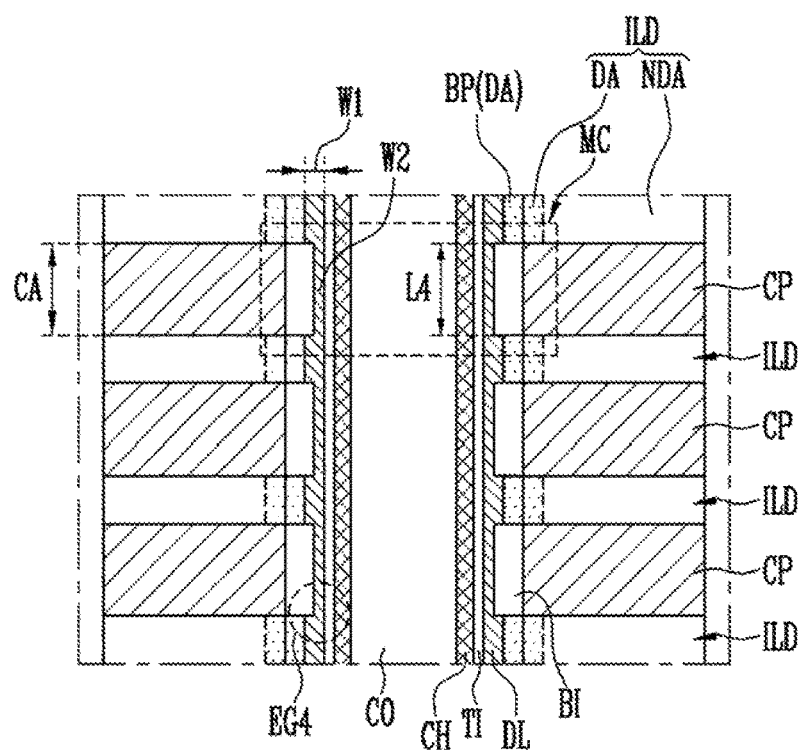

Each of the buffer patterns BP may include a densified area DA. The densified area DA may contact the data storage layer DL. As shown in FIGS. 1A and 1B, the densified area DA may be disposed only within the buffer patterns BP. Alternatively, as shown in FIGS. 1C and 1D, the densified area DA may extend into each of the interlayer insulating layers ILD that contact the buffer patterns BP. The densification degree of the densified area DA may gradually increase as it is closer to the channel layer CH. The densification degree of the densified area DA is in inverse proportion to a density of dangling bonds. That is, the less the dangling bonds, the higher the densification degree of the densified area DA is. The densified area DA may be defined as an area in which dangling bonds are cured. Hereinafter, various embodiments of the densified area DA will be described in more detail.

As shown in FIGS. 1A, 1C and 1D, the densified area DA may be distributed in the entire areas of the buffer patterns BP.

Referring to FIG. 1A, the densified area DA may be distributed on the entire areas of the buffer patterns BP and disposed only within the buffer patterns BP. In this case, an edge EG1 of the conductive area CA that is adjacent to the data storage layer DL may be formed at a right angle or a substantially right angle. The edge EG1 of the conductive area CA is defined by the buffer patterns BP and the data storage layer DL. The densified area DA may have an etching rate less than that of the interlayer insulating layers ILD because the density of the densified area DA is higher than that of the interlayer insulating layers ILD.

Referring to FIGS. 1C and 1D, the densified area DA may extend into each of the interlayer insulating layers ILD that contact the buffer patterns BP. In this case, each of the interlayer insulating layers ILD may include a densified area DA and a non-densified area NDA. The densified area DA of the interlayer insulating layer ILD may be disposed along the sidewall of the interlayer insulating layer ILD that comes into contact with the buffer pattern B P.

When the densified area DA extends into each of the interlayer insulating layers ILD, as shown in FIG. 1C, an edge EG3 of the conductive area CA that is adjacent to the data storage layer DL may have a round shape or a substantially round shape. That is, the conductive area CA may have a round edge EG3. Alternatively, as shown in FIG. 1D, an edge EG4 of the conductive area CA that is adjacent to the data storage layer DL may be formed at a right angle or a substantially right angle. That is, the conductive area CA may have a squared edge EG4. The shapes of the edges EG3 and EG4 of the conductive area CA shown in FIGS. 1C and 1D may be controlled depending on whether sacrificial layers (not shown) are cured during the manufacturing process.

As shown in FIG. 1B, each of the buffer patterns BP may include a densified area DA and a non-densified area NDA. The densified area DA may be disposed along one sidewall of the corresponding buffer pattern BP that is adjacent to the data storage layer DL. The non-densified area NDA may be disposed between the corresponding interlayer insulating layer ILD and the densified area DA. When each of the buffer patterns BP includes the densified area DA and the non-densified area NDA, an edge EG2 of the conductive area CA that is adjacent to the data storage layer DL may be formed in a round shape or a substantially round shape due to a difference in etching rate between the densified area DA and the non-densified area NDA. The edge EG2 of the conductive area CA is defined by the densified area DA, the non-densified area NDA and the data storage layer DL.

As described above with reference to FIGS. 1A to 1D, the densified area DA in accordance with the embodiment of the present disclosure may be in various structures, and the structure may be controlled in accordance with the embodiment of the present disclosure. In this way, the conductive area CA may be formed in a desired shape by controlling the structure of the densified area DA in accordance with the embodiment of the present disclosure.

In an embodiment of the present disclosure, according to a design of the memory cell MC, the width of the densified area DA is controlled, whereby the edges EG1 to EG4 of the conductive area CA that face the channel layer CH may be formed in desired shapes. Hence, in the embodiment of the present disclosure, an effective gate length or effective gate width of the memory cell MC may be controlled to a desired value.

For example, as shown in FIG. 1A, when a buffer layer is densified such that the entire area of the buffer pattern BP becomes the densified area DA, the buffer layer may be uniformly etched while a process of forming the buffer pattern BP by etching the buffer layer is performed. Thereby, the edge of the buffer pattern BP that faces the channel layer may be formed at a right angle or a substantially right angle. Therefore, the edge EG1 of the conductive area CA that faces the channel layer CH may be formed at a right angle or a substantially right angle. In this case, an effective gate length L1 of the memory cell MC may be the same as a vertical width of the conductive pattern CP, and an area through which a bias is applied to the conductive pattern CP may be increased. As a result, the speed of erase and program operations of the memory cell MC may be improved.

Alternatively, as shown in FIG. 1B, when a portion of the buffer layer is densified such that the buffer pattern BP includes a densified area DA and a non-densified area NDA, the densified area and the non-densified area NDA of the buffer layer that have different etching rates may be etched at different rates while a process of forming the buffer pattern BP by etching the buffer layer is performed. In more detail, the densified area DA may be etched at a rate less than that of the non-densified area NDA. Therefore, the edge EG2 of the conductive area CA that faces the channel layer CH may be formed in a round shape or a substantially round shape. In this case, an effective gate length L2 of the memory cell MC may be less than a vertical width of the conductive pattern CP. In addition, interference between memory cells MC which are adjacent to each other with respect to the extension direction of the channel layer CH may be reduced.

As a further alternative, as shown in FIGS. 1C and 1D, when the densified area DA extends into the interlayer insulating layer ILD, the edge EG3 or EG4 of the conductive layer CA that faces the channel layer CH may have a round shape or a substantially round shape or be formed at a right angle or a substantially right angle depending on whether sacrificial layers (not shown) are densified during the manufacturing process. Each of the edge EG3 and EG 4 is defined by the densified area DA of each of the buffer patterns BP, the densified area DA of each of the interlayer insulating layers ILD and the data storage layer DL.

Furthermore, when the densified area DA extends into the sacrificial layers (not shown) during the densification process, the edge EG3 of the conductive area CA that faces the channel layer CH may have a round shape or a substantially round shape, as shown in FIG. 1C. In this case, the effective gate length L3 of the memory cell MC may be less than the vertical width of the conductive pattern CP. In addition, interference between memory cells MC which are adjacent to each other with respect to the extension direction of the channel layer CH may be reduced.

When the densified area DA does not extend into the sacrificial layers (not shown) during the densification process, the edge EG4 of the conductive area CA that faces the channel layer CH may be formed at a right angle or a substantially right angle, as shown in FIG. 1D. In this case, the effective gate length L4 of the memory cell MC may be the same as the vertical width of the conductive pattern CP, and an area through which a bias is applied to the conductive pattern CP may be increased. As a result, the speed of the erase and program operations of the memory cell MC may be improved.

Referring to FIGS. 1A to 1D, memory cells MC in accordance with the embodiment of the present disclosure are stacked along the extension direction of the channel layer CH and thus form a memory string of a three-dimensional memory device. In this case, the interlayer insulating layers ILD and the conductive patterns CP may surround the channel layer CH and be alternately stacked.

Although FIGS. 1A to 1D illustrate an arrangement of the memory cells MC forming a memory string of a three-dimensional memory device, the embodiments of the present disclosure is not limited to them. Various modifications are possible for a semiconductor device including a memory cell MC that has a GAA structure and is disposed between interlayer insulating layers ILD.

Figure 2A:
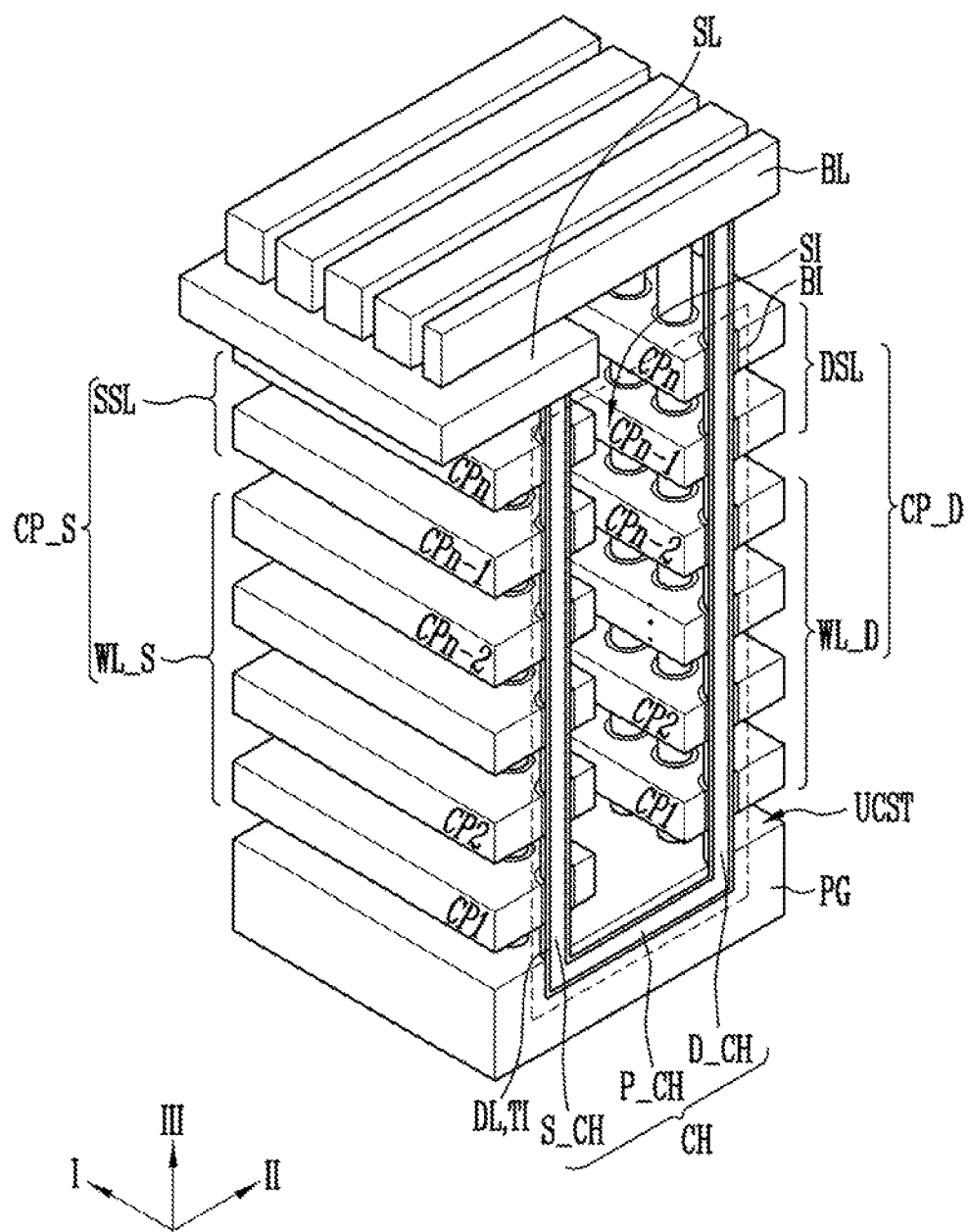
FIGS. 2A to 2C are perspective views illustrating memory strings having various structures including memory cells in accordance with embodiments of the present disclosure.
Figure 2B:
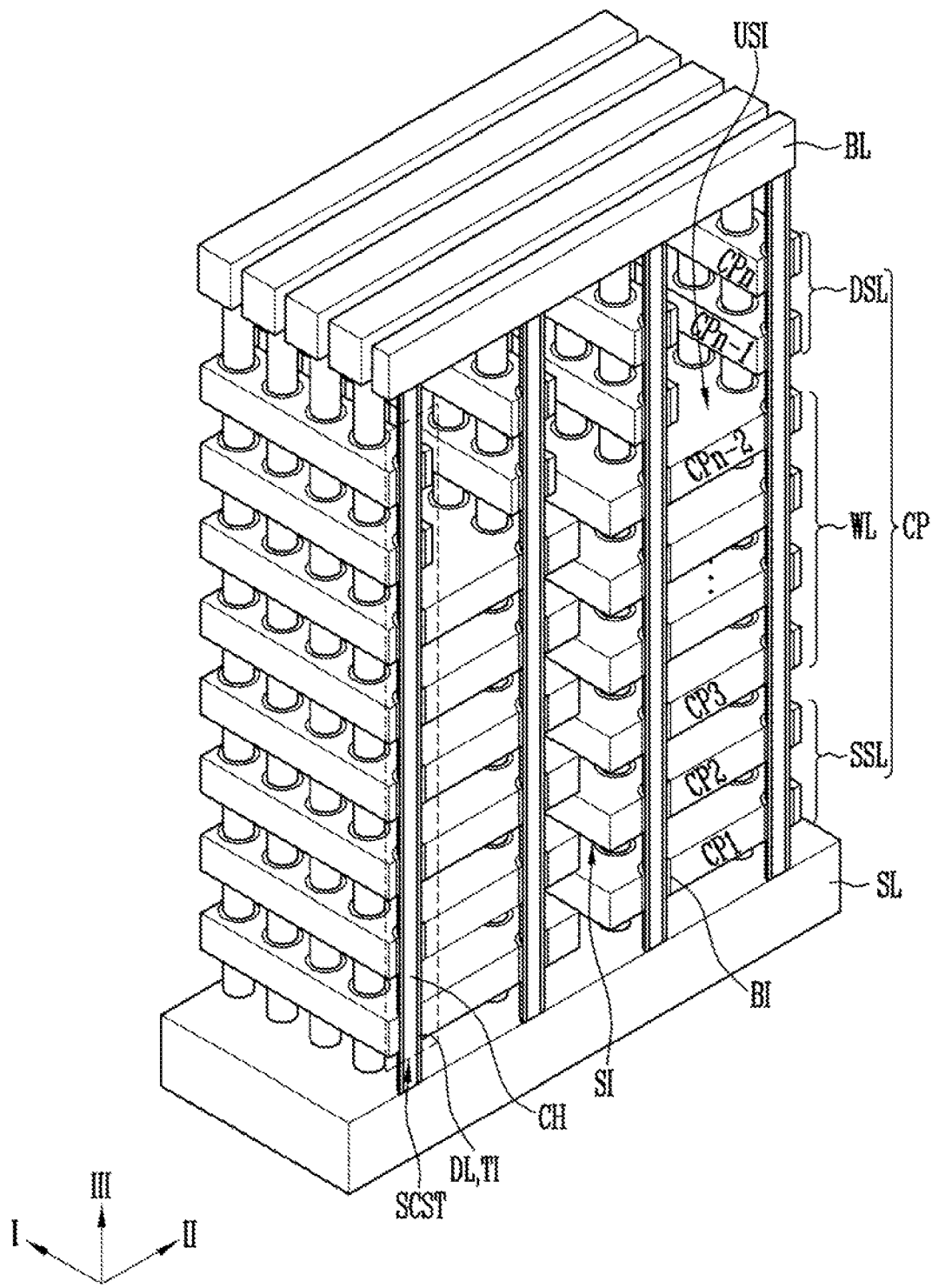
Figure 2C:
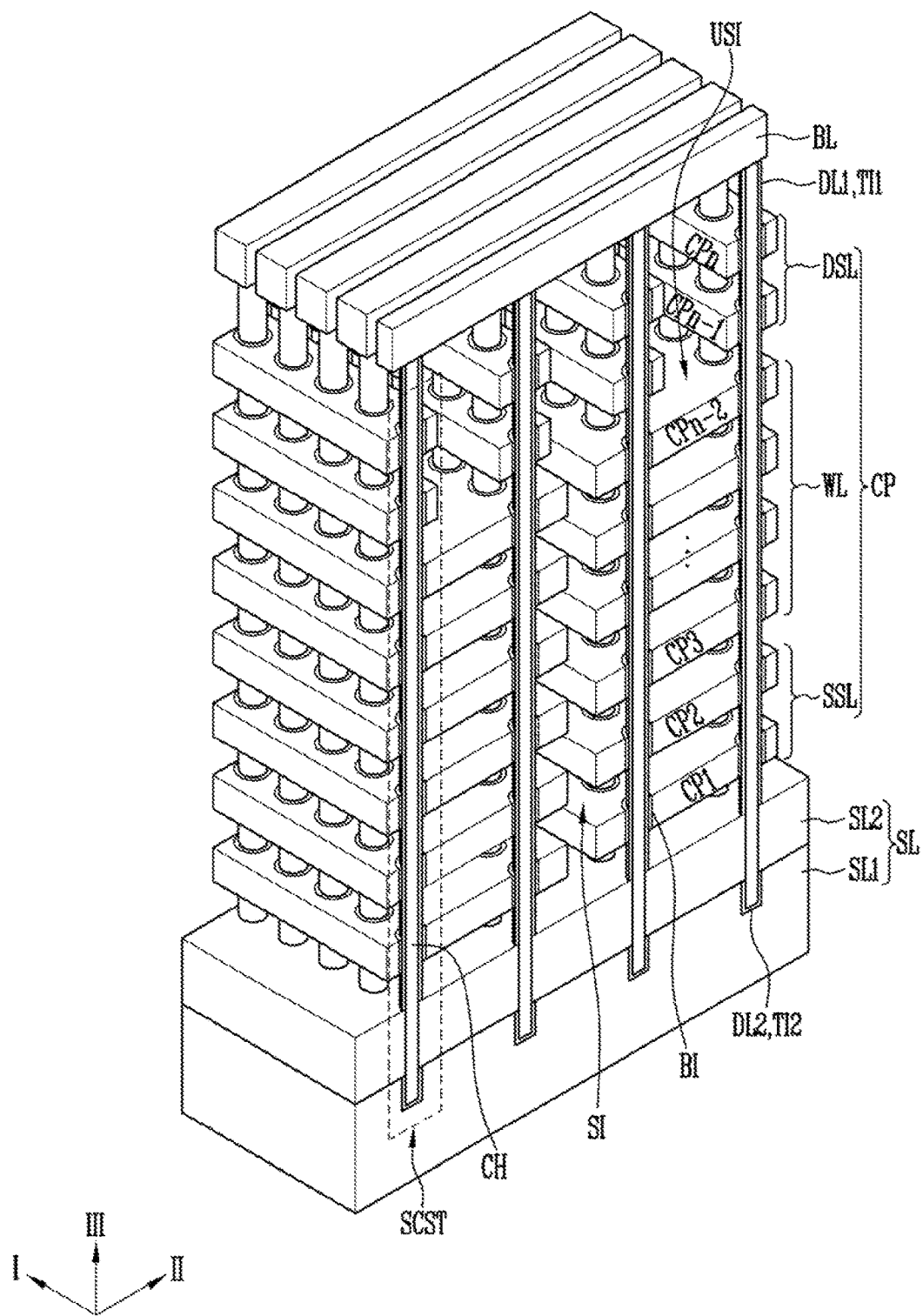

FIGS. 2A to 2C are perspective views illustrating memory strings having various structures which include memory cells in accordance with embodiments of the present disclosure. Particularly, FIGS. 2A to 2C are perspective views illustrating three-dimensional memory strings. In FIGS. 2A to 2C, interlayer insulating layers are not shown for conciseness of description.

The memory string in accordance with the embodiments of the present disclosure may have a three-dimensional structure to embody high integration of a semiconductor device. For example, the memory string may be formed in a U type shape, as shown in FIG. 2A, or in a straight type shape, as shown in FIGS. 2B and 2C.

Referring to FIG. 2A, a U type memory string UCST may include memory cells and select transistors which are arranged along a U type channel layer CH. Gates of the memory cells and gates of the select transistors may be coupled to conductive patterns CP1 to CPn.

The channel layer CH may include a pipe channel layer P_CH which is embedded in a pipe gate PG, and a source side channel layer S_CH and a drain side channel layer D_CH which extend from the pipe channel layer P_CH. The channel layer CH may be formed in the form of a tube which surrounds a core insulating layer in which a central region of a U-shaped hole is filled. Alternatively, the central region of the U-shaped hole is completely filled with the channel layer CH.

The channel layer CH may be electrically coupled between a source line SL and a bit line BL. The bit line BL and the source line SL are disposed at different layers from each other and spaced apart from each other. For example, the source line SL may be disposed below the bit line BL. The source line SL may be electrically coupled to an upper end of the source side channel layer S_CH. The source line SL may extend in a first direction I. A source contact plug may be formed between the source line SL and the source side channel layer S_CH. The bit line BL may be electrically coupled to an upper end of the drain side channel layer D_CH. The bit line BL may extend in a second direction II intersecting the first direction I. A drain contact plug may be formed between the bit line BL and the drain side channel layer D_CH.

The conductive patterns CP1 to CPn are disposed below the bit line BL and the source line SL, form an "n" number of multi-layer stacks, and are spaced apart from each other. The conductive patterns CP1 to CPn may include source side conductive patterns CP_S and drain side conductive pattern CP_D.

The source side conductive patterns CP_S may surround the source side channel layer S_CH and be stacked spaced apart from each other. The source side conductive patterns CP_S may include source side word lines WL_S and a source select line SSL. The source select line SSL may be disposed over the source word lines WL_S. The source select line SSL may have a single layered or two or more layered structure and be formed over the source side word lines WL_S. Although, in the drawing, for an example, the source select line SSL is configured with an $n_{th}$ pattern CPn that is disposed at an uppermost layer of the source side conductive patterns CP_S and with an $n-1_{th}$ pattern CPn−1 disposed below the $n_{th}$ pattern CPn, the present disclosure is not limited to this.

The drain side conductive patterns CP_D may surround the drain side channel layer D_CH and be stacked spaced apart from each other. The drain side conductive patterns CP_D may include drain side word lines WL_D and a drain select line DSL. The drain select line DSL may be disposed over the drain side word lines WL_D. The drain select line DSL may have a single layered or two or more layered structure over the drain side word lines WL_D. Although, in the drawing, for example, the drain select line DSL is configured with an $n_{th}$ pattern CPn that is disposed at an uppermost layer of the drain side conductive patterns CP_D and with an $n-1_{th}$ pattern CPn−1 disposed below the $n_{th}$ pattern CPn, the present disclosure is not limited to this configuration.

The source side conductive patterns CP_S and the drain side conductive patterns CP_D may be separated from each other by a slit SI formed therebetween.

The pipe gate PG is disposed below the source side conductive patterns CP_S and the drain side conductive patterns CP_D and formed to surround the pipe channel layer P_CH. The pipe gate PG may be disposed below the conductive patterns CP1 to CPn.

An outer sidewall of the channel layer CH may be surrounded by a tunnel insulating layer TI and a data storage layer DL. The tunnel insulating layer TI and the data storage layer DL may have the same structures as those described with reference to FIG. 1A, 1B, 1C or 1D.

The data storage layer DL may be surrounded by the blocking insulating patterns BI. The blocking insulating patterns BI may be disposed between the data storage layer DL and the respective conductive patterns CP1 to CPn. Each blocking insulating pattern BI may have the same structure as that described with reference to FIG. 1A, 1B, 1C or 1D.

Source side memory cells are formed at intersections between the source side channel layer S_CH and the source side word lines WL_S, and drain side memory cells are formed at intersections between the drain side channel layer D_CH and the drain side word lines WL_D. A source select transistor is formed at an intersection between the source side channel layer S_CH and the source select line SSL, and a drain select transistor is formed at an intersection between the drain side channel layer D_CH and the drain select line DSL. A pipe transistor is formed at an intersection between the pipe channel layer P_CH and the pipe gate PG.

The source select transistor, the source side memory cells, the pipe transistor, the drain side memory cells, and the drain select transistor that are arranged along the single channel layer CH may be coupled to each other in series through the channel layer CH. The source select transistor, the source side memory cells, the pipe transistor, the drain side memory cells and the drain select transistor that are coupled to each other in series define a U type memory string UCST along the U type shape of the channel layer CH.

The source side word lines WL_S may transmit signals to gates of the source side memory cells. The drain side word lines WL_D may transmit signals to gates of the drain side memory cells. The source select line SSL may transmit a signal to a gate of the source select transistor. The drain select line DSL may transmit a signal to a gate of the drain select transistor. The pipe gate PG may transmit a signal to a gate of the pipe transistor. The pipe transistor may couple the source side memory cells and the drain side memory cells to each other, in response to a signal applied to the pipe gate PG.

The channel layer CH may have various shapes, for example, as the above-mentioned U type shape, as a W type shape, etc. The arrangement of the memory cells may be changed in various shapes depending on the structure of the channel layer CH. Thereby, the memory string structure may also have various shapes.

Each of the source side memory cells and drain side memory cells that form the memory string UCST described with reference to FIG. 2A may have the same structure as that of any one of the memory cells described with reference to FIGS. 1A to 1D.

Referring to FIGS. 2B and 2C, a straight type memory string SCST may include memory cells and select transistors which are stacked along a straight type channel layer CH. Gates of the memory cells and gates of the select transistors may be coupled to conductive patterns CP1 to CPn.

The channel layer CH may be formed in the form of a tube which surrounds a core insulating layer. The core insulating layer may be located in a central region of a straight type hole. Alternatively, the central region of the straight type hole is completely filled with the channel layer CH.

An upper end of the channel layer CH may be electrically coupled to a bit line BL. The bit line BL may extend in a second direction II. A drain contact plug (not shown) may be further formed between the bit line BL and the channel layer CH.

The channel layer CH may be coupled to a source structure SL. The source structure SL may be formed to have various structures.

As shown in FIG. 2B, the source structure SL may contact the bottom of the channel layer CH. The source structure SL may be formed of a doped polysilicon layer. The channel layer CH may contact an upper surface of the source structure SL and extend in a third direction III toward the bit line BL.

A sidewall of the channel layer CH shown in FIG. 2B may be surrounded by a tunnel insulating layer TI and a data storage layer DL. The tunnel insulating layer TI and the data storage layer DL may have the same structures as those described with reference to FIG. 1A to 1D. The data storage layer DL may be surrounded by the blocking insulating patterns BI. The blocking insulating patterns BI may be disposed between the data storage layer DL and the respective conductive patterns CP1 to CPn. Each blocking insulating pattern BI may have the same structure as that described with reference to FIGS. 1A to 1D.

As shown in FIG. 2C, a portion of the lower end of the channel layer CH may extend into the source structure SL. That is, the lower end of the channel layer CH may pass through a portion of the source structure SL.

Furthermore, the source structure SL may have a stacked structure including a first source layer SL1 and a second source layer SL2. The first source layer SL1 may surround the lower end of the channel layer CH. The second source layer SL2 may be disposed over the first source layer SL1 and contact an upper surface of the first source layer SL1 and the sidewall of the channel layer CH. The second source layer SL2 may surround a lower sidewall of the channel layer CH.

The outer sidewall of the channel layer CH shown in FIG. 2C may be surrounded by a first tunnel insulating pattern TI1 and a first data storage pattern DL1, or by a second tunnel insulating pattern TI2 and a second data storage pattern DL2. The first tunnel insulating pattern TI1 and the first data storage pattern DL1 may have the same structures as those of the tunnel insulating layer and the data storage layer that have been described with reference to FIGS. 1A to 1D. The second tunnel insulating pattern TI2 and the second data storage pattern DL2 are disposed between the first source layer SL1 and the channel layer CH.

The first tunnel insulating pattern TI1 and the second tunnel insulating pattern TI2 may be separated from each other by the second source layer SL2 disposed therebetween. The first data storage pattern DL1 and the second data storage pattern DL2 may be separated from each other by the second source layer SL2 disposed therebetween. The first data storage pattern DL1 may be surrounded by the blocking insulating patterns BI. The blocking insulating patterns BI may be disposed between the first data storage pattern DL1 and the respective conductive patterns CP1 to CPn. Each blocking insulating pattern BI may have the same structure as that described with reference to FIGS. 1A to 1D.

Referring to FIGS. 2B and 2C, the conductive patterns CP1 to CPn may form an "n" number of layers, which are spaced apart from each other, between the bit line BL and the source structure SL. The conductive patterns CP1 to CPn may surround the channel layer CH and be stacked spaced apart from each other. The conductive patterns CP1 to CPn may include a source select line SSL, word lines WL, and a drain select line DSL. The source select line SSL may be disposed over the source structure SL. The word lines WL may be disposed over the source select lines SSL. The drain select line DSL may be disposed over the word lines WL. A stack of the conductive patterns CP1 to CPn may be divided into multiple stacks by a slit SI.

The source select line SSL may be disposed to have a single layered or two or more layered structure below the word lines WL. Although, in the drawing, for example, the source select line SSL is configured by a first pattern CP1 that is disposed at a lowermost layer of the conductive patterns CP1 to CPn and a second pattern CP2 disposed over the first pattern CP1, the present disclosure is not limited to this.

The drain select line DSL may have a single layered or two or more layered structure and may be formed over the word lines WL. Although, in the drawing, for example, the drain select line DSL is configured by an $n_{th}$ pattern CPn that is disposed at an uppermost layer of the conductive patterns CP1 to CPn and an $n-1_{th}$ pattern CPn-1 disposed below the $n_{th}$ pattern CPn, the present disclosure is not limited to this.

The conductive patterns CP1 to CPn may be separated by the slit SI. Either the source select line SSL or the drain select line DSL may be divided into smaller units than that of the word lines WL. For example, each of the channel layers CH that are surrounded by each word line WL may be surrounded by drain select lines DSL. In this case, the drain select lines DSL may be separated from each other not only by the slit SI but also by an upper slit USI so that the width thereof is smaller than that of each of the word lines WL.

According to the configuration described with reference to FIGS. 2B and 2C, memory cells are formed at intersections between the channel layer CH and the word lines WL, a drain select transistor is formed at an intersection between the channel CH and the drain select line DSL, and a source select transistor is formed at an intersection between the channel layer CH and the source select line SSL. The source select transistor, the memory cells, and the drain select transistor that are arranged in a line along the single channel layer CH are coupled in series to each other through the channel layer CH and define a straight type memory string SCST. The word lines WL may transmit signals to gates of the memory cells. The source select line SSL may transmit a signal to a gate of the source select transistor. The drain select line DSL may transmit a signal to a gate of the drain select transistor.

Each of the memory cells of the memory string SCST described with reference to FIGS. 2B and 2C may have the same structure as any one of the memory cells described with reference to FIGS. 1A to 1D.

FIGS. 3A to 3G are sectional views illustrating a method for manufacturing a semiconductor device in accordance with an embodiment of the present disclosure. Moreover, FIGS. 3A to 3G are sectional views illustrating a method for manufacturing the semiconductor device shown in FIG. 1A.

Figure 3A:
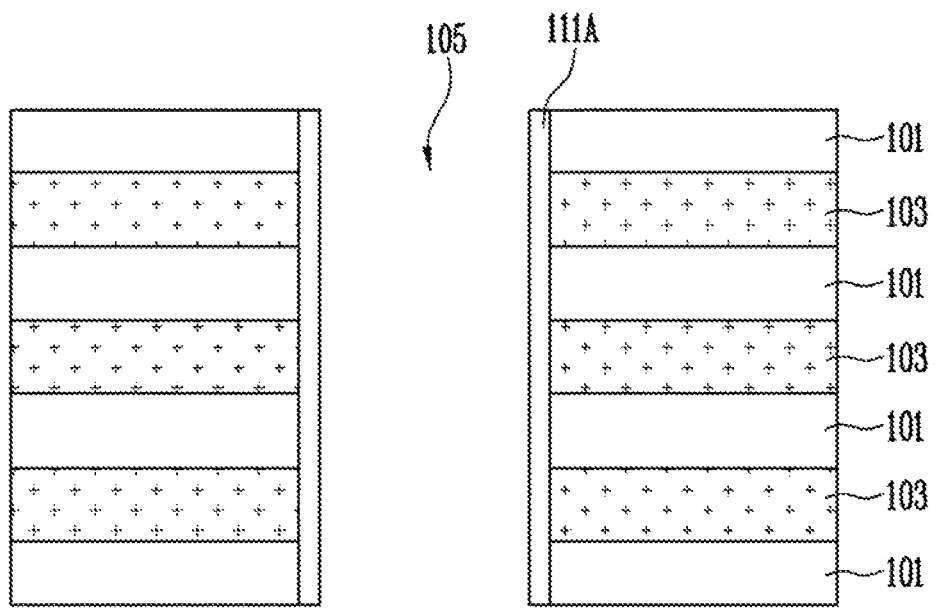
FIGS. 3A to 3G are sectional views illustrating a method for manufacturing a semiconductor device in accordance with an embodiment of the present disclosure.

Referring to FIG. 3A, the interlayer insulating layers 101 and the sacrificial layers 103 are alternately stacked. The number by which the interlayer insulating layers 101 and the sacrificial layers 103 are stacked may be set to various values. The interlayer insulating layers 101 and the sacrificial layers 103 may be formed of different materials. Furthermore, the sacrificial layers 103 may be made of material having an etch selectivity with respect to the interlayer insulating layers 101. For example, the interlayer insulating layers 101 may be made of oxide layers, and the sacrificial layers 103 may be made of nitride layers having an etch selectivity to the oxide layers.

Thereafter, the interlayer insulating layers 101 and the sacrificial layers 103 are etched to form a hole 105 passing through them.

Subsequently, a buffer layer 111A is formed on a sidewall of the hole 105. The buffer layer 111A may be made of material having an etch selectivity to the sacrificial layers 103. For example, the buffer layer 111A may be made of an oxide layer. Additionally, the buffer layer 111A may be an oxide layer having p-type impurities. The buffer layer 111A may be formed of a liner layer having a constant thickness. The buffer layer 111A may be formed by depositing an oxide layer using an Atomic Layer Deposition (ALD) method. That is, the buffer layer 111A may be formed using a deposition cycle including supplying a precursor and supplying an oxidizer. The deposition cycle may be repeated several times until the thickness of the buffer layer 111A becomes a desired thickness. The precursor for forming the buffer layer 111A may include silicon.

The buffer layer 111A may function to prevent the interlayer insulating layers 101 from being densified when a following densification process is performed.

Figure 3B:
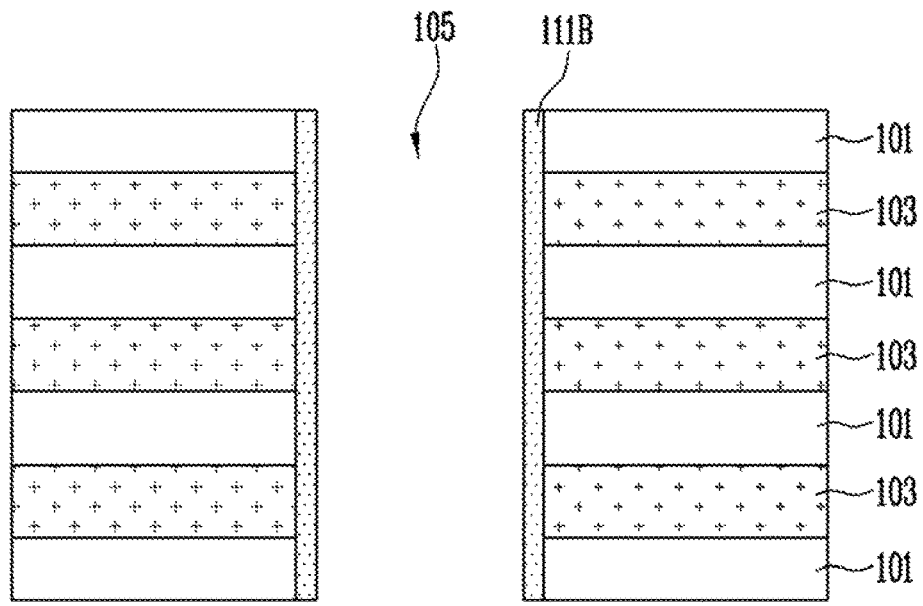

Referring to FIG. 3B, the buffer layer 111A is densified, and thus a densified buffer layer 111B in which a densified region is distributed is formed. The densification process is a process of curing dangling bonds in the buffer layer 111A and may be embodied by a radical oxidation method, a heat treatment process, furnace annealing or laser annealing. When the curing process is performed at a high temperature, the dangling bonds in the buffer layer 111A may be reduced by the curing. Process conditions of the curing process may be controlled such that the densified buffer layer 111B has a density higher than that of the interlayer insulating layers 101.

The densification process is targeted at the buffer layer 111A. During the densification process, the interlayer insulating layers 101 are protected by the buffer layer 111A so that the uniformity of the layer characteristics of the interlayer insulating layers 101 can be maintained. The densification process may be controlled such that the entirety of the buffer layer 111A is densified. The degree to which the densified buffer layer 111B is densified, that is, cured, may be increased toward the central region of the hole 105. Due to this, the dangling bonds in the densified buffer layer 111B may be decreased toward the central region of the hole 105.

During the densification process, the interlayer insulating layers 101 and the sacrificial layers 103 may be protected by the buffer layer 111A. When the interlayer insulating layers 101 and the sacrificial layers 103 are exposed to the curing process for densification, portions of sidewalls of the interlayer insulating layers 101 and the sacrificial layers 103 may be oxidized. In this case, since the interlayer insulating layers 101 and the sacrificial layers 103 are formed of different materials, they are oxidized to different thicknesses. As a result, an uneven surface structure may be formed on the sidewall of the hole 105. According to the embodiment of the present disclosure, the interlayer insulating layers 101 and the sacrificial layers 103 can be prevented from being oxidized so that deformation of the sidewall of the hole 105 can be reduced.

Figure 3C:
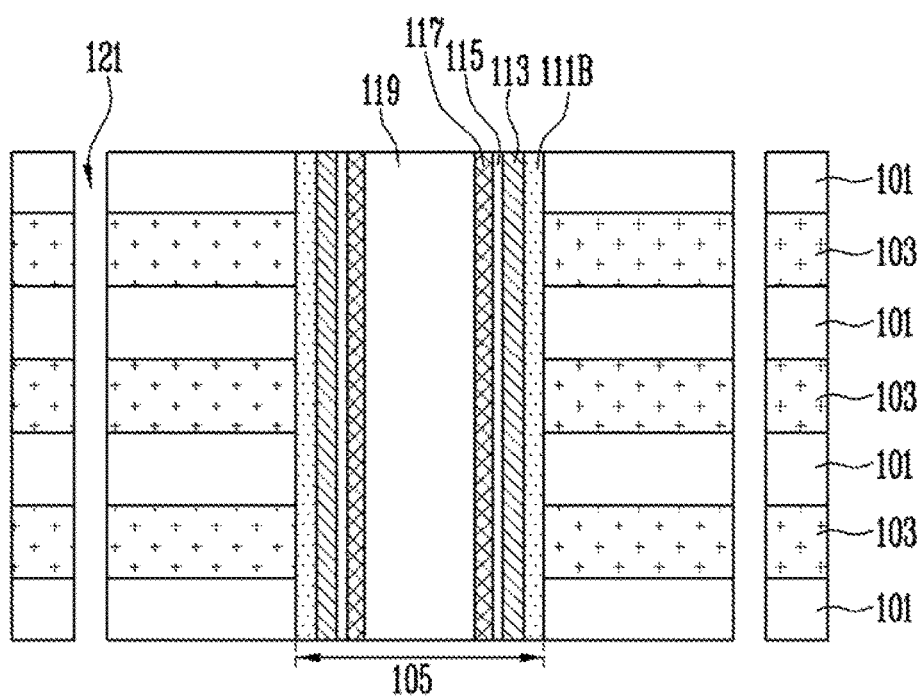

Referring to FIG. 3C, a data storage layer 113 is formed on the densified buffer layer 111B. The data storage layer 113 may be formed of a nitride layer capable of trapping charges. Thereafter, a tunnel insulating layer 115 is formed on the data storage layer 113. The tunnel insulating layer 115 may be formed of a silicon oxide layer in which charge tunneling occurs. The data storage layer 113 and the tunnel insulating layer 115 may be formed in a liner shape along the sidewall of the hole 105.

Subsequently, a channel layer 117 may be formed on the tunnel insulating layer 115. The channel layer 117 may be formed of a semiconductor layer such as a silicon layer. The channel layer 117 may be formed in a hollow shape or formed in a pillar shape. When the channel layer 117 is formed in a hollow shape, a central region of the hollow channel layer 117 may be filled with a core insulating layer 119.

Thereafter, the interlayer insulating layers 101 and the sacrificial layers 103 are etched to form a slit 121 passing through them.

Figure 3D:
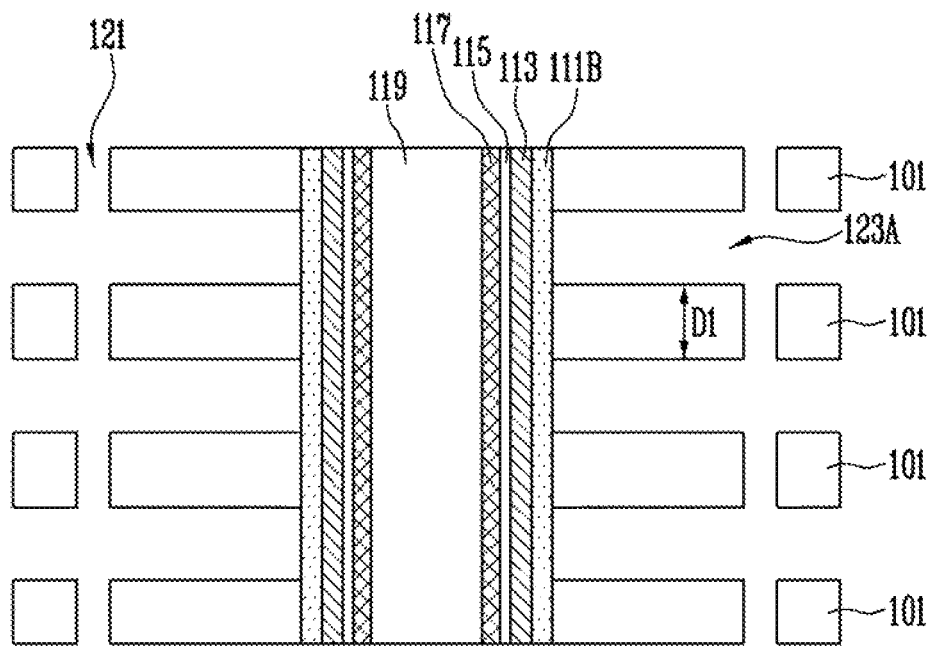

Referring to FIG. 3D, the sacrificial layers 103 are removed through the slit 121. When the sacrificial layers 103 are formed of nitride layers, phosphoric acid may be used to remove the sacrificial layers 103.

As the sacrificial layers 103 are removed, first conductive areas 123A that expose the densified buffer layer 111B may be defined between the interlayer insulating layers 101 that are adjacent to each other with respect to the direction in which the channel layer 117 extends. In this case, each interlayer insulating layer 101 may remain with a first thickness D1.

When the sacrificial layers 103 are removed, the densified buffer layer 111B having an etch selectivity to the sacrificial layers 103 may function as an etch stop layer and thus protect the data storage layer 113.

Figure 3E:
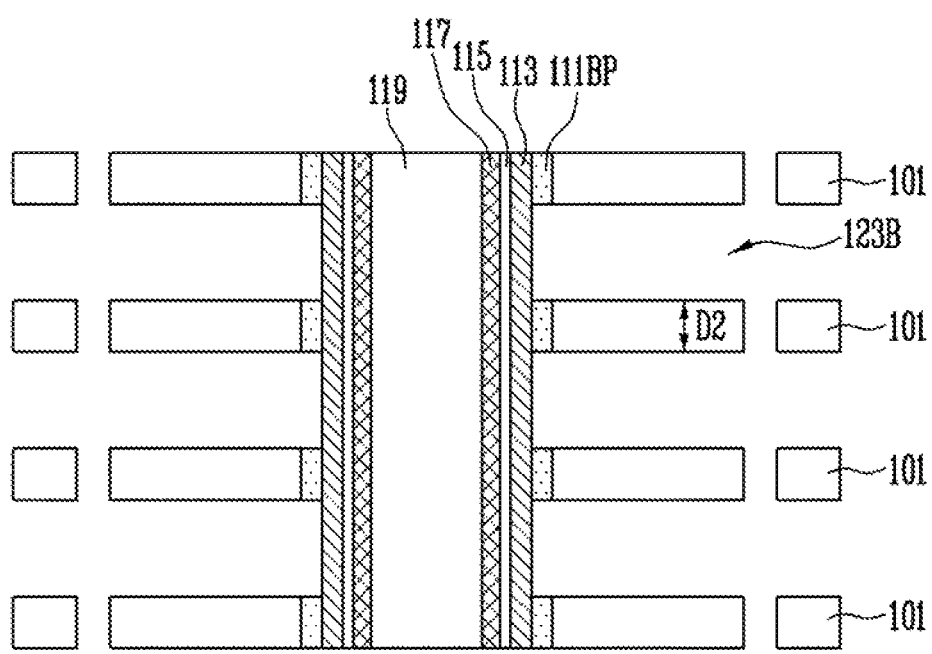

Referring to FIG. 3E, the densified buffer layer 111B exposed through the first conductive areas 123A is etched such that the data storage layer 113 is exposed. In this case, portions of the interlayer insulating layers 101 are etched, whereby each interlayer insulating layer 101 may remain with a second thickness D2 less than the first thickness D1. In this case, second conductive areas 123B, each of which has a vertical width greater than that of each first conductive area (123A of FIG. 3D), may be defined between the interlayer insulating layers 101. The data storage layers 113 are exposed by second conductive areas 123B. The densified buffer layer (111B of FIG. 3D) may be divided into buffer patterns 111BP by the second conductive areas 123B.

While the densified buffer layer (111B of FIG. 3D) is etched, the data storage layer 113 having an etch selectivity to the densified buffer layer (111B of FIG. 3D) may remain without being removed.

Figure 3F:
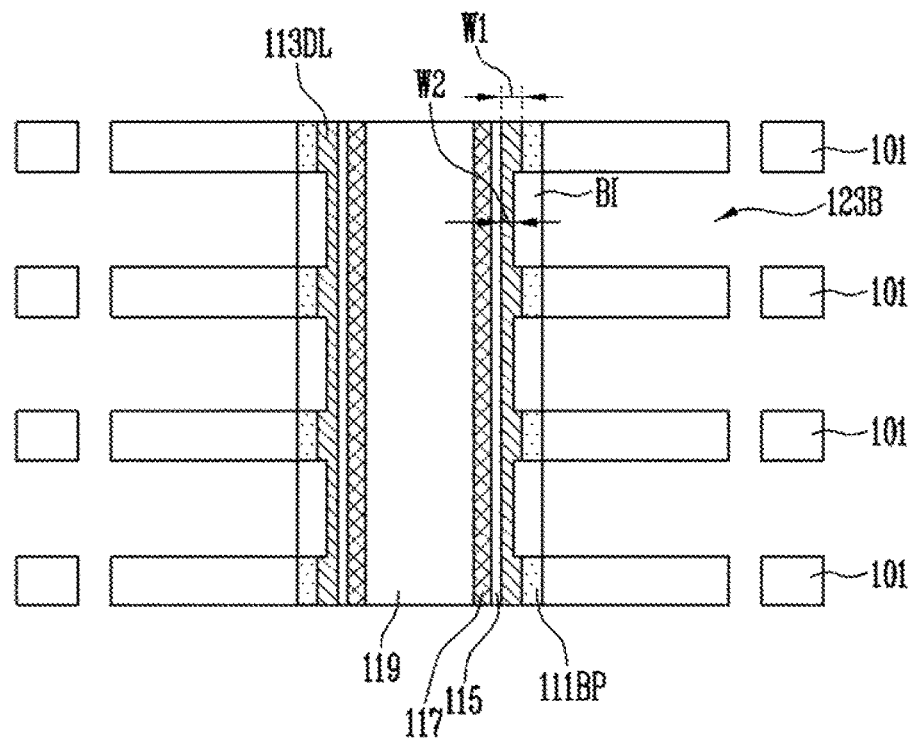

Referring to FIG. 3F, blocking insulating patterns BI are formed by oxidizing partial areas of the data storage layer (113 of FIG. 3e) exposed through the second conductive areas 123B. As a result, a data storage layer 113DL having an uneven surface structure may be formed. The data storage layer 113DL having the uneven surface structure may include a first area and a second area. The first area refers to portions of the data storage layer 113DL that contact the buffer patterns 111BP and remain with a first thickness W1. The second area refers to the other portions of the data storage layer 113DL which contact the blocking insulating patterns BI and remain with a second thickness W2 less than the first thickness W1.

Figure 3G:
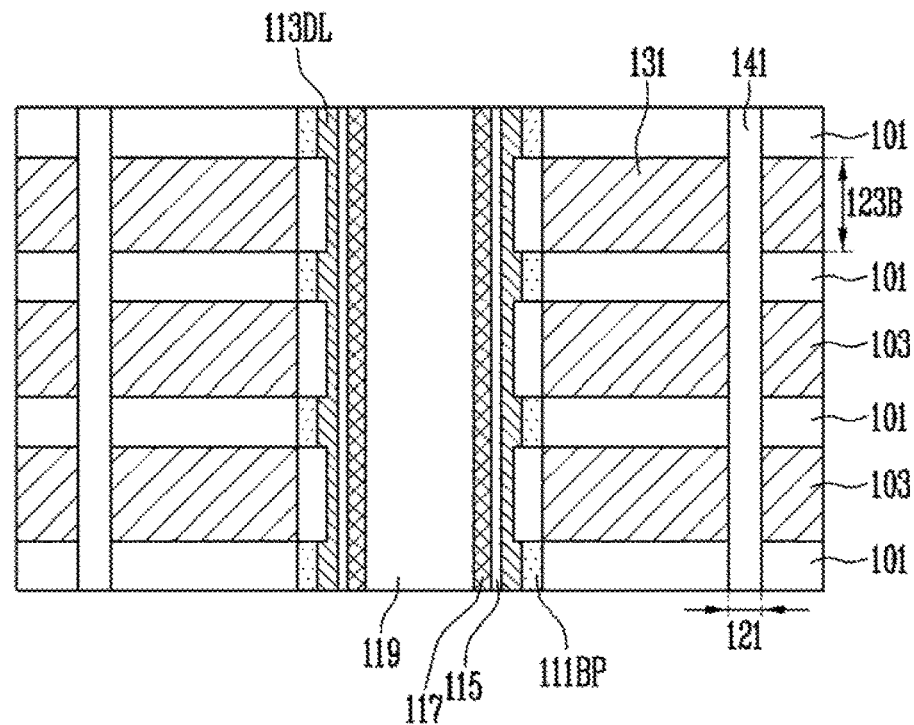

Referring to FIG. 3G, conductive patterns 131 may be formed on the blocking insulating patterns BI such that the second conductive areas 123B between the interlayer insulating layers 101 are filled with the conductive patterns 131. Each conductive pattern 131 may include a polysilicon layer, a metal layer, a metal silicide layer, or a combination thereof. Low-resistance metal such as tungsten may be used as the material of a metal layer for forming the conductive patterns 131. Thereafter, the slit 121 may be filled with an insulating layer 141.

According to the embodiment of the present disclosure, the first conductive areas are defined by etching the densified buffer layer which has uniform layer characteristics. Therefore, according to the embodiment of the present disclosure, there is almost no etching rate difference while the densified buffer layer is etched, and thus the edges of the first conductive areas may be formed at a right angle or a substantially right angle.

Figure 4A:
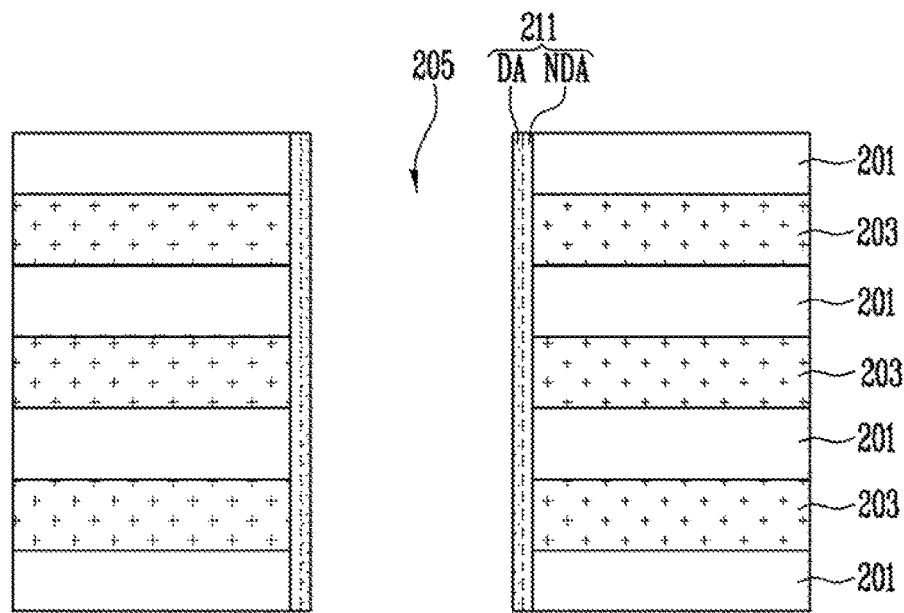
FIGS. 4A and 4B are sectional views illustrating a method for manufacturing a semiconductor device in accordance with an embodiment of the present disclosure.
Figure 4B:
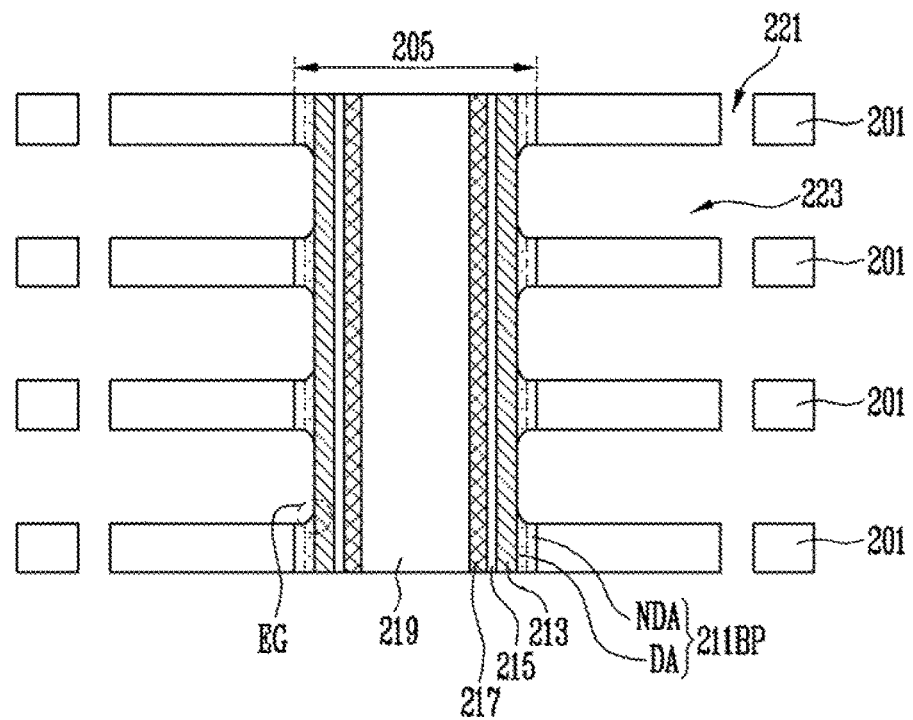

FIGS. 4A and 4B are sectional views illustrating a method for manufacturing a semiconductor device in accordance with an embodiment of the present disclosure. In more detail, FIGS. 4A and 4B are sectional views illustrating a method for manufacturing the semiconductor device shown in FIG. 1B.

Referring to FIG. 4A, interlayer insulating layers 201 and sacrificial layers 203 that are respectively formed of the same materials as those described with reference to FIG. 3A are alternately stacked.

Thereafter, the interlayer insulating layers 201 and the sacrificial layers 203 are etched so as to form a hole 205 passing through them. Thereafter, a buffer layer is formed on the sidewall of the hole 205 using the same material and method as those described with reference to FIG. 3A.

Thereafter, a partial area of the buffer layer that is adjacent to the sidewall of the hole 205 remains as a non-densified area NDA, and the other area of the buffer layer is densified through a curing process. In this case, a densified area DA is formed in the buffer layer. The densified area DA may be formed to have a predetermined thickness from an exposed surface of the buffer layer. Thereby, the densified buffer layer 211 may include the densified area DA and the non-densified area NDA. The sidewall of the hole 205 may be spaced apart from the densified area DA by the non-densified area NDA.

The curing process for the densification may be embodied by a radical oxidation method, a heat treatment process, furnace annealing or laser annealing, as described with reference to FIG. 3B. The densified area DA may have a smaller amount of dangling bonds than that of the interlayer insulating layers 201 or the non-densified area NDA. During the curing process for the densification, the interlayer insulating layers 201 and the sacrificial layers 203 may be protected by the buffer layer. Thereby, in the present embodiment, the interlayer insulating layers 201 and the sacrificial layers 203 can be prevented from being oxidized, so that deformation of the sidewall of the hole 205 can be reduced.

Referring to FIG. 4B, a data storage layer 213, a tunnel insulating layer 215 and a channel layer 217 may be formed on the densified buffer layer 211 through the same processes as those described with reference to FIG. 3C. When the channel layer 217 is formed in a hollow shape, a central region of the hollow channel layer 217 may be filled with a core insulating layer 219.

Thereafter, the interlayer insulating layers 201 and the sacrificial layers (203 of FIG. 4A) are etched to form a slit 221 passing through them. Subsequently, the sacrificial layers (203 of FIG. 4A) are removed through the same process as that described with reference to FIG. 3D. The densified buffer layer (211 of FIG. 4A) is thereafter etched through the same process as that described with reference to FIG. 3E. Thereby, conductive areas 223 are defined between the interlayer insulating layers 201. The conductive areas 223 may expose partial areas of the data storage layer 213 and divide the densified buffer layer (211 of FIG. 4A) into buffer patterns 211BP.

While the densified buffer layer (211 of FIG. 4A) is etched, the data storage layer 213 having an etch selectivity to the densified buffer layer (211 of FIG. 4A) may remain without being removed. The densified buffer layer (211 of FIG. 4A) includes the densified area DA and the non-densified area NDA that have different etching rates from each other. Therefore, while the densified buffer layer (211 of FIG. 4A) is etched, the densified area DA having a relatively high density is etched at an etching rate lower than that of the non-densified area NDA. As a result, an edge EG of each conductive area 223 that is adjacent to the data storage layer 213 may be formed in a round shape.

Subsequently, the same processes as those described with reference to FIGS. 3F and 3G are performed, whereby blocking insulating patterns and conductive patters may be formed. In this way, memory cells having the structure shown in FIG. 1B may be formed.

According to the foregoing embodiment of the present disclosure, the buffer patterns with edges having a desired round shape may be formed by controlling the thickness of the densified area formed in the densified buffer layer. Thereby, the embodiment of the present disclosure can control the shape of the edges of the buffer patterns such that the memory cell has optimized performance.

Figure 5A:
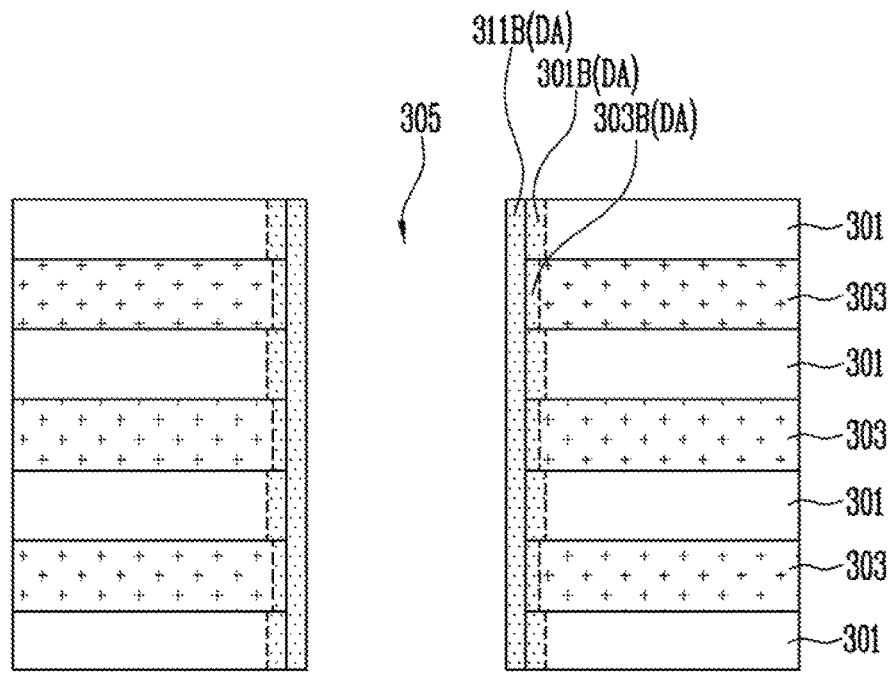
FIGS. 5A and 5B are sectional views illustrating a method for manufacturing a semiconductor device in accordance with an embodiment of the present disclosure.
Figure 5B:
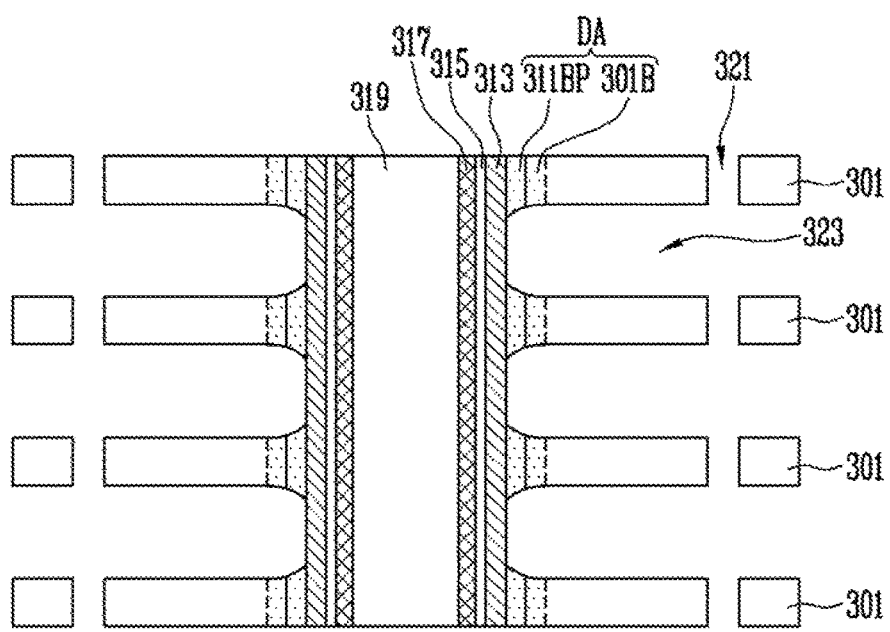

FIGS. 5A and 5B are sectional views illustrating a method for manufacturing a semiconductor device in accordance with an embodiment of the present disclosure. In more detail, FIGS. 5A and 5B are sectional views illustrating a method for manufacturing the semiconductor device shown in FIG. 1C.

Referring to FIG. 5A, interlayer insulating layers 301 and sacrificial layers 303 that are respectively formed of the same materials as those described with reference to FIG. 3A are alternately stacked.

Thereafter, the interlayer insulating layers 301 and the sacrificial layers 303 are etched to form a hole 305 passing through them. Subsequently, a buffer layer is formed on the sidewall of the hole 305 using the same material and method as those described with reference to FIG. 3A.

A curing process for densification is thereafter performed. The curing process may be performed such that the entire area of the buffer layer, partial areas of the respective interlayer insulating layers 301 that are adjacent to the buffer layer, and sidewalls of the respective sacrificial layers 303 that are adjacent to the buffer layer are densified. Thereby, the densified area DA may be formed in the entire area of the buffer layer, sidewalls of the respective interlayer insulating layers 301 that are adjacent to the buffer layer, and sidewalls of the respective sacrificial layers 303 that are adjacent to the buffer layer.

A densified buffer layer 311B, a first densified sidewall 301B of each interlayer insulating layer 301, and a second densified sidewall 303B of each sacrificial layer 303 may be formed by a radical oxidization method.

Referring to FIG. 5B, a data storage layer 313, a tunnel insulating layer 315 and a channel layer 317 may be formed on the densified buffer layer 311B through the same processes as those described with reference to FIG. 3C. When the channel layer 317 is formed in a hollow shape, a central region of the hollow channel layer 317 may be filled with a core insulating layer 319.

Thereafter, the interlayer insulating layers 301 and the sacrificial layers (303 of FIG. 5A) are etched to form a slit 321 passing through them. The sacrificial layers (303 of FIG. 5A) are thereafter removed through the same process described with reference to FIG. 3D. Subsequently, the second densified sidewall (303B of FIG. 5A) is etched. In this case, the edge of the first densified sidewall 301B may be etched to have a round shape by a difference in etching rate due to a difference in material characteristics between the first densified sidewall 301B and the second densified sidewall (303B of FIG. 5A). Thereafter, the densified buffer layer (311B of FIG. 5A) is etched. Thereby, conductive areas 323 are defined between the interlayer insulating layers 301. The conductive areas 323 may expose partial areas of the data storage layer 313 and divide the densified buffer layer (311B of FIG. 5A) into buffer patterns 311BP. The buffer patterns 311BP and the first densified sidewall 301B remain as the densified area DA.

Subsequently, the same processes as those described with reference to FIGS. 3F and 3G are performed, whereby blocking insulting patterns and conductive patters are formed. In this way, memory cells having the structure shown in FIG. 1C may be formed.

According to the foregoing embodiment of the present disclosure, the conductive areas with edges having a desired round shape may be formed by controlling the thickness of the densified area formed in the sidewalls of the interlayer insulating layers. Thereby, the embodiment of the present disclosure can control the shape of the edges of the conductive areas such that the memory cell has optimized performance.

Figure 6A:
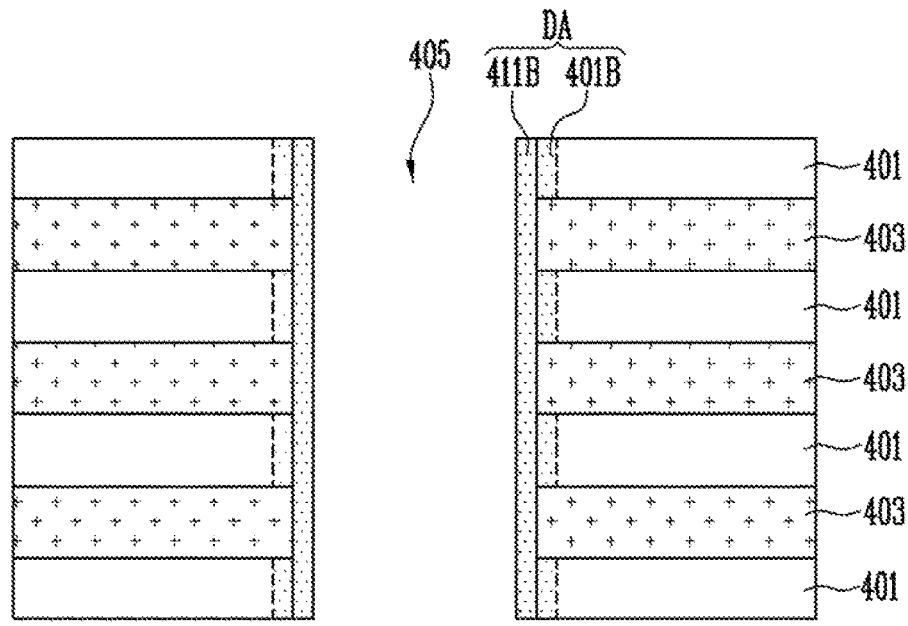
FIGS. 6A and 6B are sectional views illustrating a method for manufacturing a semiconductor device in accordance with an embodiment of the present disclosure.
Figure 6B:
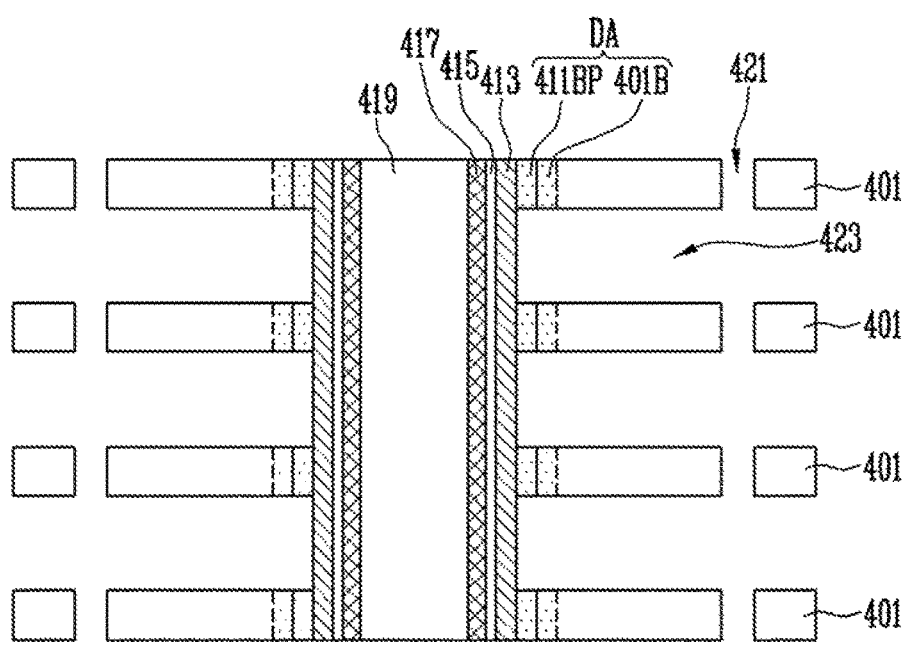

FIGS. 6A and 6B are sectional views illustrating a method for manufacturing a semiconductor device in accordance with an embodiment of the present disclosure. Moreover, FIGS. 6A and 6B are sectional views illustrating a method for manufacturing the semiconductor device shown in FIG. 1D.

Referring to FIG. 6A, interlayer insulating layers 401 and sacrificial layers 403, that are respectively formed of the same materials as those described with reference to FIG. 3A, are alternately stacked.

Thereafter, the interlayer insulating layers 401 and the sacrificial layers 403 are etched to form a hole 405 passing through them. Subsequently, a buffer layer is formed on the sidewall of the hole 405 using the same material and method as those described with reference to FIG. 3A.

A curing process for densification is thereafter performed. The curing process may be performed such that the entire area of the buffer layer and partial areas of the respective interlayer insulating layers 401 that are adjacent to the buffer layer are densified. Thereby, the densified area DA may be distributed in the entire area of the buffer layer, and sidewalls of the respective interlayer insulating layers 401 that are adjacent to the buffer layer.

A densified buffer layer 411B and densified sidewalls 401B of the respective interlayer insulating layers 401 may be processed by a heat treatment process, furnace annealing or laser annealing. The heat treatment process, the furnace annealing or the laser annealing may be controlled such that the sacrificial layers 403 formed of nitride layers are prevented from being oxidized.

Referring to FIG. 6B, a data storage layer 413, a tunnel insulating layer 415 and a channel layer 417 may be formed on the densified buffer layer 411B through the same processes as those described with reference to FIG. 3C. When the channel layer 417 is formed in a hollow shape, a central region of the hollow channel layer 417 may be filled with a core insulating layer 419.

Thereafter, the interlayer insulating layers 401 and the sacrificial layers (403 of FIG. 6A) are etched to form a slit 421 passing through them. Subsequently, the sacrificial layers (403 of FIG. 6A) are removed through the same process as that described with reference to FIG. 3D. The densified buffer layer (411B of FIG. 6A) is thereafter etched through the same process as that described with reference to FIG. 3E. Thereby, conductive areas 423 are defined between the interlayer insulating layers 401. According to the embodiment of the present disclosure, since there is almost no etching rate difference in the densified buffer layer while the densified buffer layer (411B of FIG. 6A) is etched, the edges of the conductive areas 423 may be formed at a right angle or a substantially right angle.

The conductive areas 423 may expose partial areas of the data storage layer 413 and divide the densified buffer layer (411B of FIG. 6A) into buffer patterns 411BP. The buffer patterns 411BP and the densified sidewall 401B remain as the densified area DA.

Subsequently, the same processes as those described with reference to FIGS. 3F and 3G are performed, whereby blocking insulting patterns and conductive patters are formed. In this manner, memory cells having the structure shown in FIG. 1D may be formed.

According to the foregoing embodiment of the present disclosure, the conductive areas with the edges having a right-angled shape may be formed using the curing process through which the sacrificial layers are not oxidized.

In the above-mentioned embodiments of the present disclosure, a range within which a densified area is formed is quantitatively controlled, whereby conductive areas with edges having various shapes can be defined. Therefore, the shape of the edges of the conductive areas can be controlled such that memory cells have optimized performance.

Figure 7:
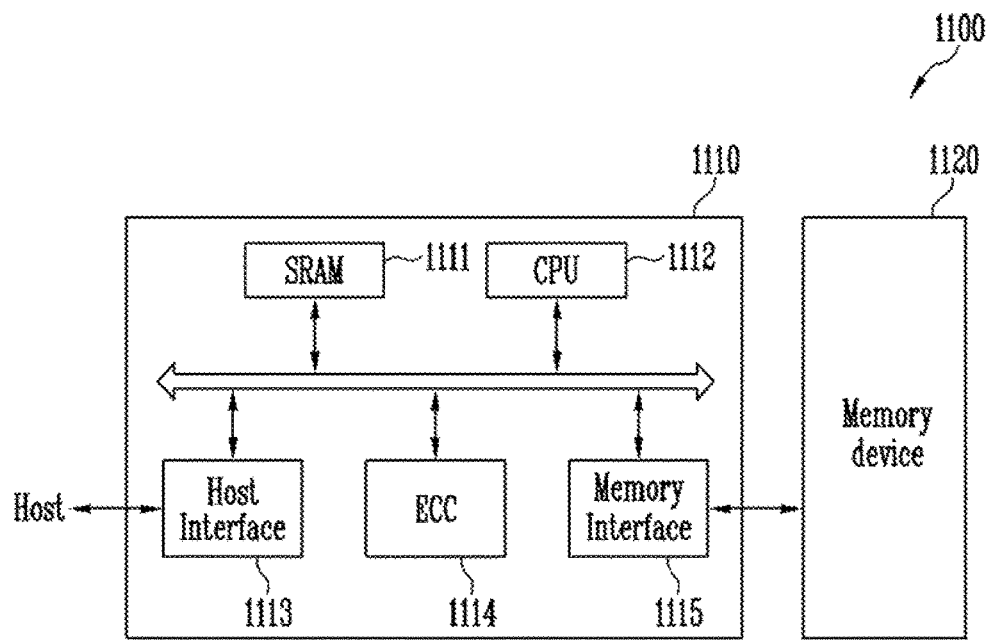
FIG. 7 is a block diagram illustrating a memory system in accordance with an embodiment of the present disclosure.

FIG. 7 is a block diagram illustrating a memory system according to an embodiment of the present disclosure. Referring FIG. 7, the memory system 1100 according to the embodiment includes a memory device 1120 and a memory controller 1110.

The memory device 1120 may include at least one of the memory cells described with reference to FIGS. 1A to 1D. The memory device 1120 may include at least one of the memory strings described with reference to FIGS. 2A to 2C. Each memory string may include at least one of the memory cells having the structures described with reference to FIGS. 1A to 1D. The memory cells may be formed through the processes described with reference to FIGS. 3A to 3G, the processes described with reference to FIGS. 4A and 4B, the processes described with reference to FIGS. 5A and 5B, or the processes described with reference to FIGS. 6A and 6B. The memory device 1120 may be a multi-chip package including a plurality of memory chips.

The memory controller 1110 is configured to control the memory device 1120, and may include a Static Random Access Memory (SRAM) 1111, a CPU 1112, a host interface 1113, an Error Correction Code (ECC) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host and is coupled with the memory system 1100. Furthermore, the ECC 1114 detects and corrects an error included in the data that is read from the memory device 1120, and the memory interface 1115 interfaces with the memory device 1120. In addition, the memory controller 1110 may further include a Read Only Memory (ROM) or the like that stores code data for interfacing with the host.

The above-described memory system 1100 may be a memory card or a Solid State Disk SSD) equipped with the memory device 1120 and the controller 1110. For example, when the memory system 1100 is an SSD, the memory controller 1110 may communicate with the outside for example, a host via one of various interface protocols, such as an Universal Serial Bus (USB), a MultiMedia Card (MMC), a Peripheral Component Interconnection-Express (PCI-E), a Serial Advanced Technology Attachment (SATA), a Parallel Advanced Technology Attachment (PATA), a Small Computer Small Interface (SCSI), an Enhanced Small Disk Interface (ESDI), or an Integrated Drive Electronics (IDE).

Figure 8:
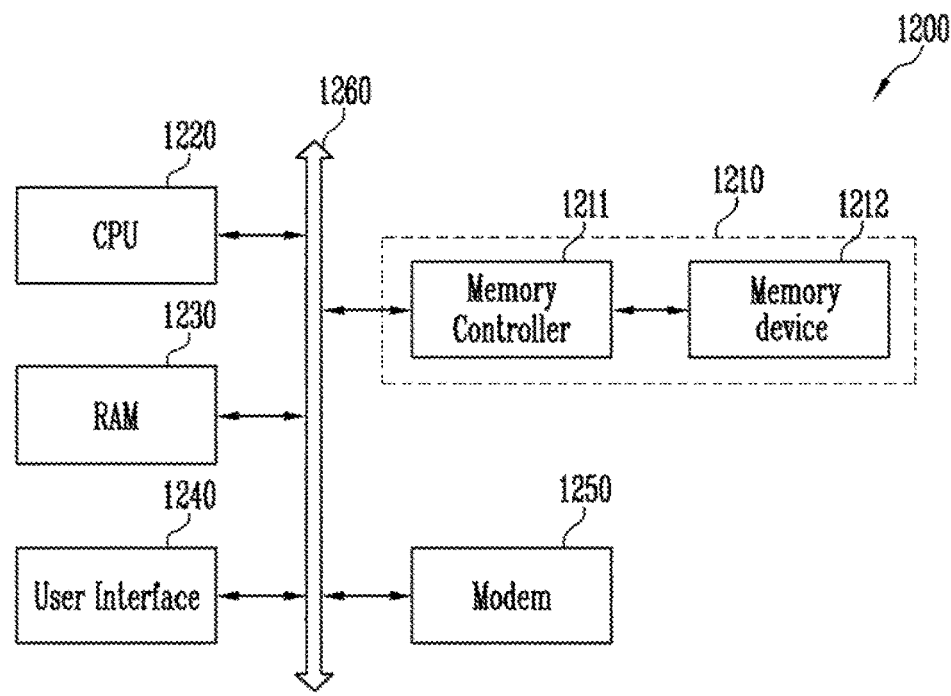
FIG. 8 is a block diagram illustrating a computing system in accordance with an embodiment of the present disclosure.

FIG. 8 is a block diagram illustrating a computing system in accordance with an embodiment of the present disclosure. Referring to FIG. 8, the computing system 1200 in accordance with the embodiment of the present disclosure may include a CPU 1220, a Random Access Memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 7, the memory system 1210 may be configured with the memory device 1212 and the memory controller 1211.

In the embodiments of the present disclosure, the thickness of the densified area may be quantitatively controlled by defining the densified area after the buffer layer has been formed. Thereby, in the embodiments of the present disclosure, the edge of the conductive area defined between the interlayer insulating layers may be formed in a desired shape. Since the profile of the conductive pattern is defined depending on the shape of the edge of the conductive area, the profile of the conductive pattern according to the embodiments of the present disclosure may be formed in a desired shape.

In the embodiments of the present disclosure, the thickness of the densified area can be quantitatively controlled such that the shape of the edge of the conductive pattern is formed in a shape capable of optimizing the operational reliability of the semiconductor device. Therefore, the operational reliability of the semiconductor device may be improved.

Example embodiments have been disclosed herein, and although specific terms are employed, they are used and are to be interpreted in a generic and descriptive sense only and are not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
a channel layer;
a data storage layer surrounding the channel layer and extending along the channel layer;
interlayer insulating layers surrounding the data storage layer and stacked along the channel layer, wherein the interlayer insulating layers are spaced apart from each other, wherein a conductive area is disposed between the interlayer insulating layers;
a conductive pattern disposed in the conductive area and surrounding the data storage layer;
buffer patterns disposed between the interlayer insulating layers and the data storage layer and surrounding the data storage layer, wherein each of the buffer patterns includes a densified area, wherein the buffer patterns are separated from each other by the conductive area; and
a blocking insulating pattern disposed between the conductive pattern and the data storage layer and surrounding the data storage layer,
wherein the densified area is partially formed within each of the buffer patterns.

2. The semiconductor device according to claim 1, wherein the densified area is formed along a first sidewall of each of the buffer patterns,
wherein the first sidewall is adjacent to the data storage layer,
wherein each of the buffer patterns further includes a non-densified area, and
wherein the non-densified area is disposed between each of the interlayer insulating layers and the densified area.

3. The semiconductor device according to claim 2, wherein the conductive area has a first edge,
wherein the first edge is defined by the densified area of each of the buffer patterns, the non-densified area of each of the buffer patterns, and the data storage layer, and
wherein the first edge of the conductive area is rounded.

4. The semiconductor device according to claim 1, wherein the data storage layer comprises:
first areas disposed between the buffer patterns and the channel layer; and
a second area disposed between the blocking insulating pattern and the channel layer, the second area being thinner than the first areas.

5. The semiconductor device according to claim 1, wherein the data storage layer comprises:
a first portion facing the channel layer and having a planar structure; and
a second portion facing the interlayer insulating layers and the conductive pattern and having an uneven surface structure.

6. The semiconductor device according to claim 1, wherein a densification degree of the densified area is gradually increased from each of the interlayer insulating layers toward the channel layer.

7. The semiconductor device according to claim 6, wherein the densification degree is in reverse proportion to a number of dangling bonds included in each of the buffer patterns.

8. The semiconductor device according to claim 1, wherein a density of the densified area is higher than a density of each of the interlayer insulating layers.

9. A semiconductor device comprising:
a channel layer;
a data storage layer surrounding the channel layer and extending along the channel layer;
interlayer insulating layers surrounding the data storage layer and stacked along the channel layer, wherein the interlayer insulating layers are spaced apart from each other, wherein a conductive area is disposed between the interlayer insulating layers;
a conductive pattern disposed in the conductive area and surrounding the data storage layer;
buffer patterns disposed between the interlayer insulating layers and the data storage layer and surrounding the data storage layer, wherein each of the buffer patterns includes a densified area, wherein the buffer patterns are separated from each other by the conductive area; and
a blocking insulating pattern disposed between the conductive pattern and the data storage layer and surrounding the data storage layer, wherein each of the buffer patterns is solely formed of the densified area and contacts the data storage layer, wherein the interlayer insulating layers have sidewalls that contact the buffer patterns, respectively, and wherein the densified area further extends from each of the buffer patterns into each of the sidewalls of the interlayer insulating layers.

10. The semiconductor device according to claim 9, wherein the conductive area has a first edge, wherein the first edge is defined by the buffer patterns and the data storage layer, and wherein the first edge of the conductive area has a right angle.

11. The semiconductor device according to claim 9, wherein the conductive area has a first edge, wherein the first edge is defined by the densified area of each of the buffer patterns, the densified area extending in each of the interlayer insulating layers, and the data storage layer, and wherein the first edge of the conductive area is right-angled or rounded.

12. The semiconductor device according to claim 9, wherein the data storage layer comprises:

a first portion facing the channel layer and having a planar structure; and a second portion facing the interlayer insulating layers and the conductive pattern and having an uneven surface structure.

13. A semiconductor device comprising:

interlayer insulating layers and conductive patterns alternately stacked on each other;

a channel layer passing through the interlayer insulating layers and the conductive patterns; and a buffer pattern disposed between the channel layer and each of the interlayer insulating layers, wherein the buffer pattern includes a densified area having a higher density than each of densities of the interlayer insulating layers, wherein a densification degree of the densified area is gradually increased from the interlayer insulating layers toward the channel layer.

14. The semiconductor device according to claim 13, wherein a number of dangling bonds included in the densified area is gradually decreased from the interlayer insulating layers toward the channel layer.

15. The semiconductor device according to claim 13, further comprising a data storage layer disposed between the channel layer and each of the conductive patterns.

16. The semiconductor device according to claim 15, wherein the data storage layer extends between the buffer pattern and each of the interlayer insulating layers, and the densified area extends from a first sidewall of the buffer pattern to a second sidewall of the buffer pattern, and wherein the first sidewall is toward the data storage layer and the second sidewall is toward the interlayer insulating layers.

17. The semiconductor device according to claim 16, wherein the densified area extends into each of the interlayer insulating layers.

18. The semiconductor device according to claim 13, wherein the buffer pattern further includes a non-densified area defined between the densified area and each of the interlayer insulating layers.

* * * * *